United States Patent
Kojima et al.

(10) Patent No.: US 7,286,400 B2
(45) Date of Patent: Oct. 23, 2007

(54) NON-VOLATILE SEMICONDUCTOR MEMORY DEVICE WITH PASS/FAIL DETECTION CIRCUIT

(75) Inventors: Masatsugu Kojima, Kawasaki (JP); Koji Hosono, Fujisawa (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/219,756

(22) Filed: Sep. 7, 2005

(65) Prior Publication Data

US 2006/0050564 A1   Mar. 9, 2006

(30) Foreign Application Priority Data

Sep. 8, 2004   (JP) ............... 2004-261008

(51) Int. Cl.
   *G11C 16/06*   (2006.01)
(52) U.S. Cl. ................................. 365/185.09
(58) Field of Classification Search ........... 365/185.09, 365/185.12, 185.17, 185.22
   See application file for complete search history.

(56) References Cited

U.S. PATENT DOCUMENTS

| | | | |
|---|---|---|---|
| 6,650,578 B2 | 11/2003 | Kojima et al. | |
| 6,813,184 B2 * | 11/2004 | Lee | 365/185.09 |
| 6,819,596 B2 * | 11/2004 | Ikehashi et al. | 365/185.22 |
| 6,831,859 B2 | 12/2004 | Hosono et al. | |
| 6,859,401 B2 | 2/2005 | Hosono et al. | |
| 6,865,112 B2 | 3/2005 | Kawai et al. | |
| 6,967,868 B2 * | 11/2005 | Kim et al. | 365/185.09 |
| 2006/0050564 A1 | 3/2006 | Kojima et al. | |

OTHER PUBLICATIONS

Koji Hosono, et al., "A High Speed Failure Bit Counter for the Pseudo Pass(PPS) in Program Operation for Giga Bit NAND Flash", Dig., non-vol., Memory Workshop, Feb. 2003, pp. 23-26.

* cited by examiner

*Primary Examiner*—Hoai V. Ho
(74) *Attorney, Agent, or Firm*—Oblon, Spivak, McClelland, Maier & Neustadt, P.C.

(57) ABSTRACT

A non-volatile semiconductor memory device includes: a memory cell array, in which electrically rewritable and non-volatile memory cells are arranged: a sense amplifier circuit configured to read data of the memory cell array; and a pass/fail detection circuit configured to detect write or erase completion based on verify-read data stored in the sense amplifier circuit in data write or erase mode, wherein the pass/fail detection circuit comprises a data latch, into which a defective column isolation data is writable in accordance with a command input.

9 Claims, 14 Drawing Sheets

| (B2, B1, B0) | I pass | Detection Number of Fails |
|---|---|---|
| (0, 0, 0) | 0.5 I | ≧1 |
| (0, 0, 1) | 1.5 I | ≧2 |
| (0, 1, 0) | 2.5 I | ≧3 |
| (0, 1, 1) | 3.5 I | ≧4 |
| (1, 0, 0) | 4.5 I | ≧5 |
| (1, 0, 1) | 5.5 I | ≧6 |
| (1, 1, 0) | 6.5 I | ≧7 |
| (1, 1, 1) | 7.5 I | ≧8 |

NON-VOLATILE SEMICONDUCTOR MEMORY DEVICE WITH PASS/FAIL DETECTION CIRCUIT

CROSS-REFERENCE TO RELATED APPLICATION

This application is based on and claims the benefit of priority from the prior Japanese Patent Application No. 2004-261008, filed on Sep. 8, 2004, the entire contents of which are incorporated herein by reference.

BACKGROUND OF THE INVENTION

1. Field of the Invention

This invention relates to an electrically rewritable and non-volatile semiconductor memory device (EEPROM).

2. Description of Related Art

A write sequence of an EEPROM flash memory is usually performed by repeat of a write pulse application and the following write-verify for driving a data threshold distribution into a certain range. After the verify-read operation, verify-judgment (i.e., pass/fail detection) is performed for checking whether the entire write data have been written or not. In case the write completion is detected for all bits, the write sequence ends, while in case it is detected that there is an insufficiently written bit, the write voltage will be applied again.

The maximum, value of the number of write voltage applications, Nmax, (i.e., write cycle number or loop number) is usually predetermined. When data write completion is not detected in spite of that the write cycle number has already reached Nmax, the write sequence is finished in failure.

In a case that a flash memory system has an ECC function outside or inside of the chip, it will be permitted to contain certain failures (fail bit number or fail column number) determined with relation to the ECC function. Therefore, it is desirable that the fail number is detected at when the data write sequence ends in failure, and when the resultant is in a range of the permissible fail number, it is dealt with "pseudo-pass".

From such the view point, there has already been provided a flash memory, in which the verify judgment can be performed at a high speed, and pass/fail can be detected with relation to the permissible fail number (refer to patent document 1: Unexamined Japanese Patent Application Publication No. 2002-140899).

In a flash memory with a large capacitance, it is usually used a redundancy system for relieving the memory of its defects. That is, there is prepared redundant cell arrays for so replacing a defect portion (for example a defective column) with a redundant cell array in such a case that permissible defects have been founded at a test time before shipment. Further, in the memory chip, there are prepared a defective address storage circuit and an address matching circuit for detecting address matching between the externally supplied address and the stored defective address in the defective address storage circuit. With these circuits, the defective address replacement may be controlled.

Usually, the defective address storage circuit is formed of a fuse circuit or a ROM circuit. Alternatively, there has been provided such a scheme that defective addresses are stored in the memory cell array together with various initial setup data without using the above-described fuse circuit and ROM circuit (for example, see patent document 2: Unexamined as Japanese Patent Application Publication No. 2001-176290).

In case the above-described redundancy system is adapted, it is in need of excluding the defective portion from the verify target in the verify-judgment. If not so, the data write cycle is repeated until the cycle number reaches the maximum value Nmax, and the write sequence ends in failure. This is the same as in the erase mode. Therefore, data latches are disposed in the verify-judgment circuit to store isolation data for isolating defective columns (see, the patent document 1).

SUMMARY OF THE INVENTION

According to an aspect of the present invention, there is provided a non-volatile semiconductor device including:

a memory cell array, in which electrically rewritable and non-volatile memory cells are arranged;

a sense amplifier circuit configured to read data of the memory cell array; and a pass/fail detection circuit configured to detect write or erase completion based on verify-read data stored in the sense amplifier circuit in data write or erase mode, wherein the pass/fail detection circuit comprises a data latch, into which a defective column isolation data is writable in accordance with a command input.

According to another aspect of the present invention, there is provided a non-volatile semiconductor memory device including:

a memory cell array, in which electrically rewritable and non-volatile memory cells are arranged:

a sense amplifier circuit configured to read data of the memory cell array;

a pass/fail detection circuit configured to detect write or erase completion based on verify-read data stored in the sense amplifier circuit in data write or erase mode; and a controller configured to control a write sequence by repeat of write and write-verify, and make the pass/fail detection circuit do verify-judgment within a write step.

DETAILED DESCRIPTION OF THE EMBODIMENTS

Illustrative embodiments of this invention will be explained with reference to the accompanying drawings below.

In the conventional flash memory, it is not dealt with a defect generated after shipment. Since, as described above some failures are permissible with relation to the ECC function, defects generated after shipment also are permissible in a certain range. However, if such the late generated defect is left as it is, it becomes to take a long time for data-writing or erasing because the write sequence including a defect address always ends in failure after having repeated with the maximum write cycle number Nmax. This is the same as in the erase mode.

The embodiments described below are provided for preventing the flash memory from being made long in write or erase time due to the late generated defect.

Embodiment 1

Figure 1:
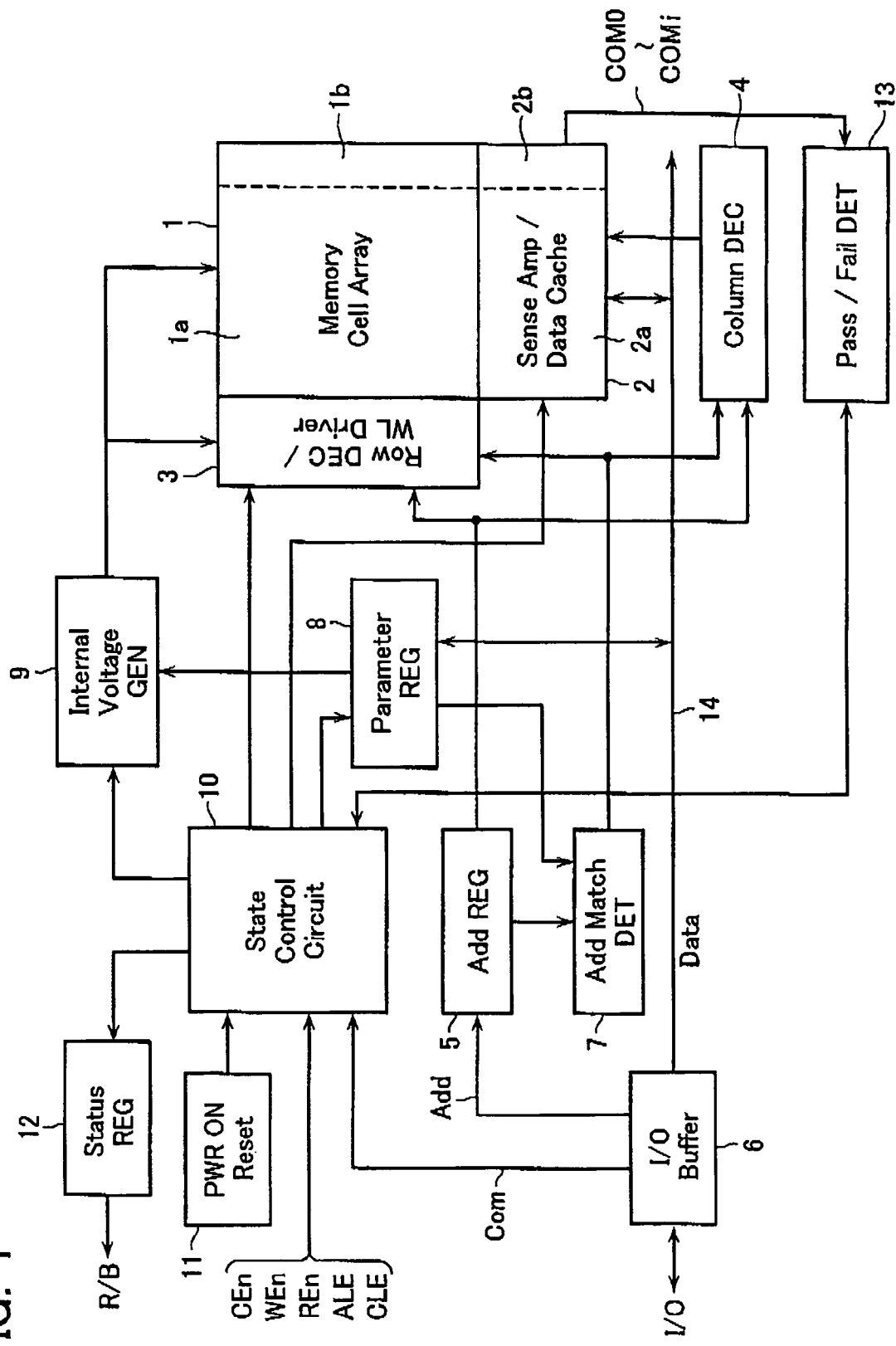
FIG. 1 shows a functional block of a flash memory in accordance an embodiment of the present invention.
Figure 2:
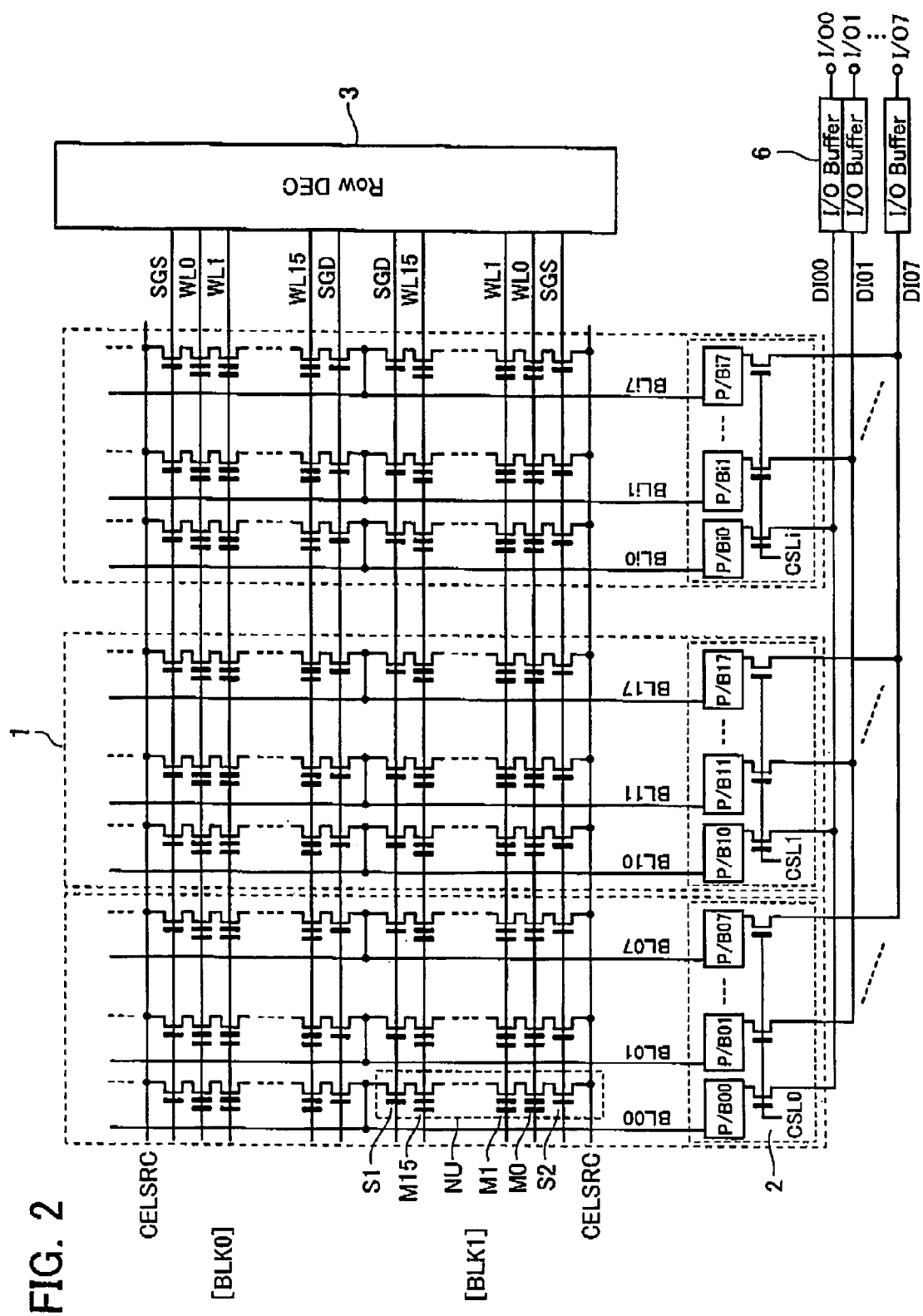
FIG. 2 shows the memory dell array of the flash memory.

FIG. 1 shows a functional block configuration of a flash memory in accordance with an embodiment, and FIG. 2 shows an arrangement of the memory cell array 1.

The memory cell array 1 is formed of NAND cell units NU arranged in a matrix manner. Each NAND cell unit NU has a plurality of (sixteen in the example shown in FIG. 2) memory cells M0-M15 connected in series and select gate transistors S1 and S2 disposed at both ends thereof. The select gate transistors S1 and S2 couple the both ends of the memory cell string to a bit line BL and a source line CELSRC, respectively.

Control gates of the memory cells in a NAND cell unit are coupled to different word lines WL0-WL15. Gates of the select gate transistors S1 and S2 are coupled to select gate lines SGD and SGS, respectively.

A set of NAND cell units sharing word lines WL0-WL15 constitutes a block, which serves as a unit of data erase. As shown in FIG. 2, a plurality of blocks (BLK0, BLK1, . . . ) are arranged in the direction of the bit line BL.

A row decoder 3 is prepared for selecting and driving word lines and select gate lines in response to a row address, which includes word line drivers and select gate line drivers. A sense amplifier circuit 2 is prepared to be connected to bit lines of the memory cell array 1, which serves not only for reading data for a page but also as a data latch circuit for storing write data of a page. With this sense amplifier circuit 2, data read or write is performed by a page. The sense amplifier circuit 2 includes a data cache for transmitting data between data bus and itself.

As shown in FIG. 1, the memory cell array 1 includes a normal cell array 1a and a redundant column cell array 1b used in place of a defective column in the normal cell array 1a. Corresponding to it, the sense amplifier circuit 2 also has a normal sense amplifier circuit 2a and a redundant sense amplifier circuit 2b.

Figure 3:
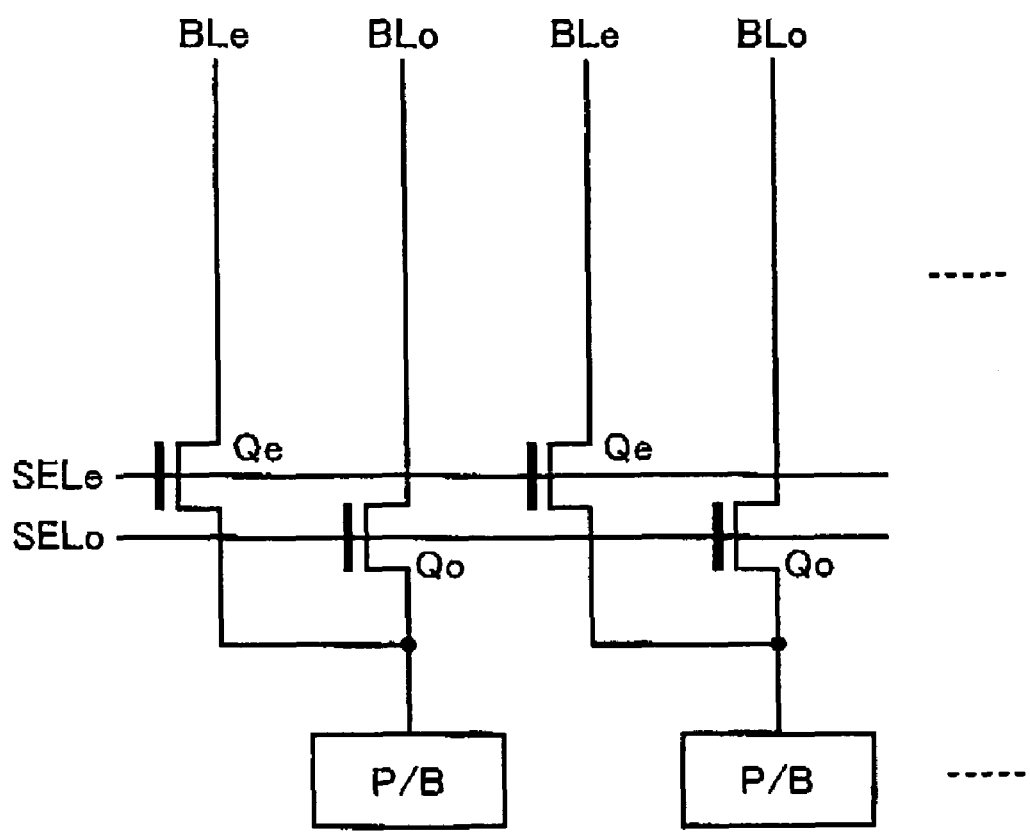
FIG. 3 shows an example of arrangement of sense amplifiers sharing bit lines.

FIG. 2 shows such an example that the sense amplifier circuit 2 has sense amp units P/B prepared for every bit line BL. However, as the memory cell array 1 is more miniaturized, it becomes difficult to arrange sense units at the bit line pitch. In consideration of this point, it is used such a scheme in a flash memory with a large capacitance that, as shown in FIG. 3, adjacent two bit lines BLe and BLo shares a sense unit P/B. The adjacent two bit lines BLe and BLo are selectively coupled to the sense unit P/B via bit line select transistors Qe and Qo.

In the example shown in FIG. 2, a set of memory cells arranged along a word line constitutes a page, while in the scheme, in which two bit lines share a sense unit, a set of memory cells arranged along a word line constitutes two pages.

Data transmitting between the sense amplifier circuit 2 and external I/O terminals is performed via I/O buffers 6 and via a data bus 14. The sense amplifier circuit 2 has column gate circuits controlled by column select signals CSLi output from a column decoder 4. Supposing that, for example, eight I/O terminals, I/O0-I/O7, are prepared, data are serially transferred between the sense amplifier circuit 2 and the I/O terminals by a byte (by a column).

Address "Add" supplied via the I/O terminal is transferred to the row decoder 3 and column decoder 4 via an address register 5. Command "Com" supplied via the I/O terminal is decoded in a state control circuit (refer to as a controller hereinafter) 10, which controls a data read operation and a write or erase sequence based on the command "Com" and various external control signals (write enable signal WEn, read enable signal REn, command latch enable signal CLE, address latch enable signal ALE and the like).

An Internal voltage generating circuit 9 is prepared to generate various internal voltages necessary for read, write and erase under the control of the controller 10, in which boost circuits are used for generating internal voltages higher than the power supply voltage. A status register 12 is prepared to output a status signal R/B outside of the chip, which designates whether the chip is in a busy state or a ready state.

A parameter register 8 stores various kinds of initial setup data, in which voltage adjusting data are contained to adjust the internal voltages generated from the internal voltage generating circuit 9, and defective address data. These data are stored in advance in an initial setup data area set in the memory cell array 1. When the power supply is switched on, a power-on reset circuit 11 outputs a power-on detecting signal. In response to it, the controller 10 automatically reads out the initial setup data in the memory cell array 1, which are transferred to and set in the parameter register 8.

An address match detecting circuit 7 is formed to detect whether the externally supplied address is identical with a defective address stored in the parameter register 8, thereby outputting an address replace control signal. With this signal, it is controlled that a redundant column is selected in place of a defective column.

Figure 4:
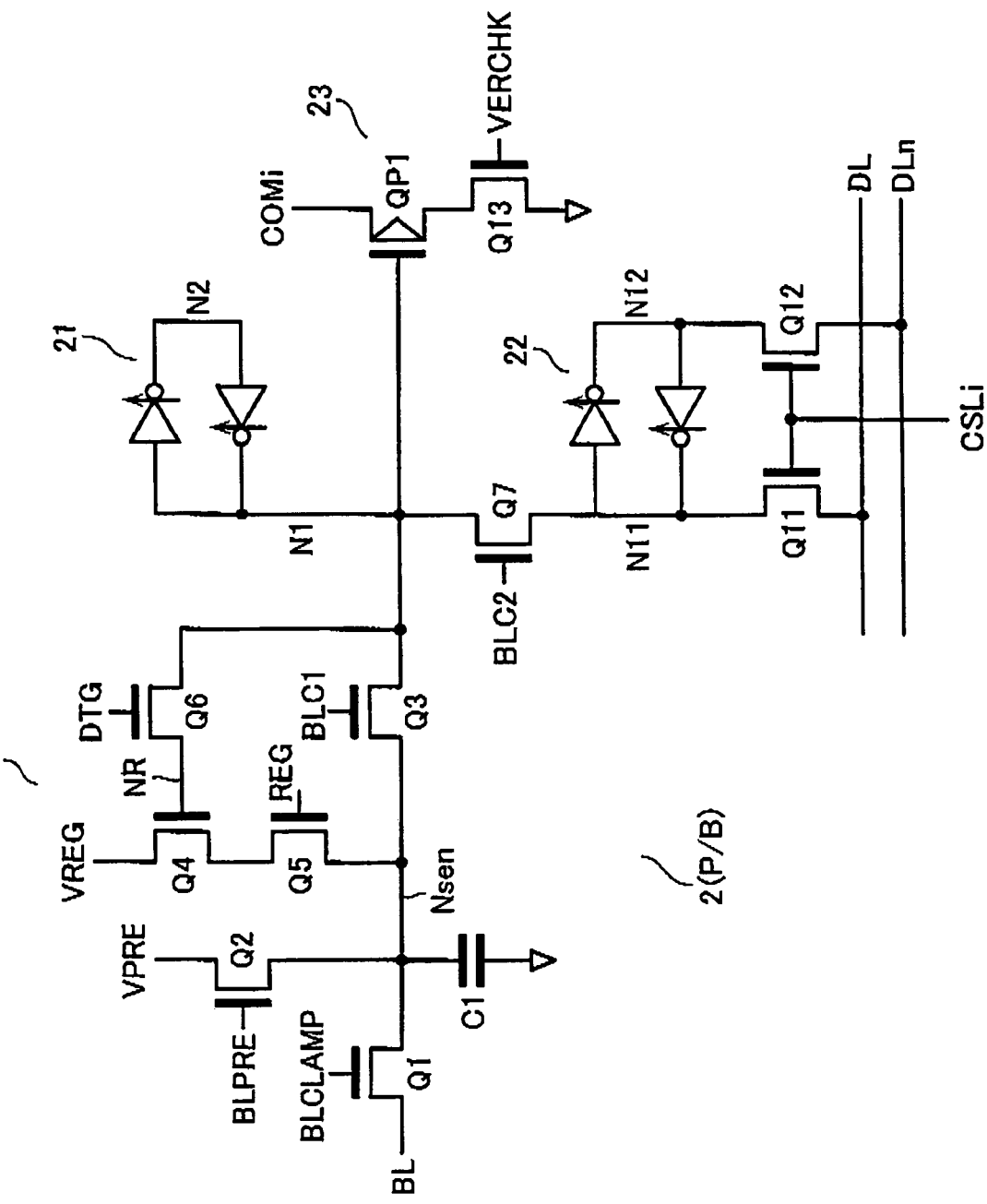
FIG. 4 shows a configuration of the sense amplifier circuit of the flash memory.

FIG. 4 shows a configuration of one sense unit P/B in the sense amplifier circuit 2. A NMOS transistor MN1, which is disposed between sense node Nsen and bit line BL, serves for clamping the precharge voltage of the bit line BL and serves as a pre-sense amp for amplifying the bit line voltage. A precharging NMOS transistor Q2 and a charge holding capacitor C (if necessary) are connected to the sense node Nsen.

The sense node Nsen is coupled to a data node N1 of a data latch 21 via a transferring NMOS transistor Q3. A data storage circuit 24 is disposed between the data node N1 and sense node Nsen for temporarily storing verify-read data. The gate of NMOS transistor Q4, drain of which is coupled to a voltage node VREG, serves as a data storage node NR. A data transferring NMOS transistor Q6 is disposed between the data storage node NR and data node N1. To transfer the voltage VREG to the sense node Nsen in accordance with data stored at the data storage node NR, NMOS transistor Q5 is disposed between the NMOS transistor Q4 and the sense node Nsen.

The data storage circuit 24 stores write data of the last cycle to serve as a write-back circuit for writing back "0" data to the data latch 21 only for a cell, into which "0" data is insufficiently written. In other words, it is controlled in such a way that the data latches 21 of one page show an all "1" state when the entire bits have been completely written.

Another data latch 22 constituting a data cache is coupled to the data node N1 via a transferring NMOS transistor Q7. Read/write data of one page are simultaneously transferred between data latches 21 and 22. Data nodes N11 and N12 of the data latch 22 are coupled to complementary data lines DL and DLn via column select gates Q11 and 012, respectively, which are driven with a column select signal CSLi.

Figure 5:
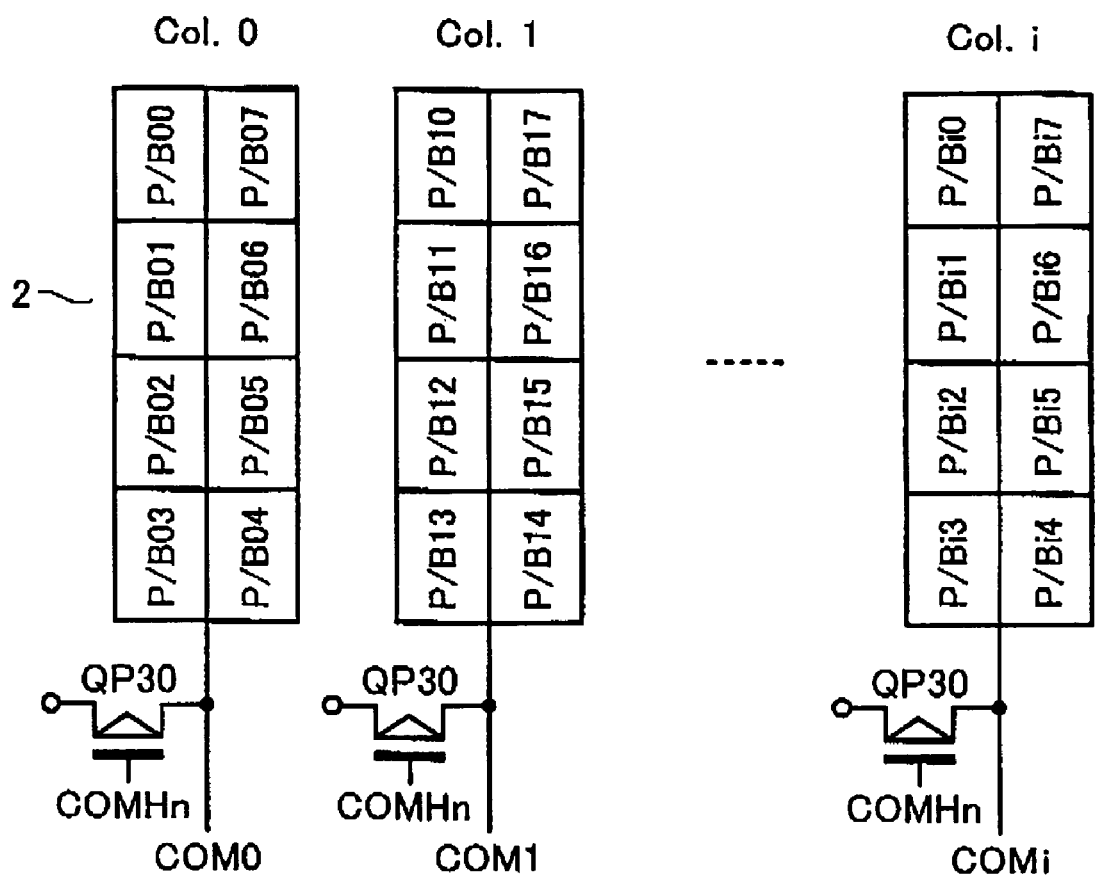
FIG. 5 shows an example of detection line arrangement connected to the sense amplifier circuit for verify-judgment.

A data detect circuit 23, i.e., verify-check circuit, is connected to the data node N1, which is activated at a verify-judgment time. The data detecting circuit has a PMOS transistor QP1, the gate of which is connected to the data node N1, and a switching NMOS transistor 013 disposed between the source of PMOS transistor QP1 and ground (Vss) node. The source of PMOS transistor QP1 is coupled to a first detection line COMi, which is, as shown in FIG. 5, shared with eight sense units P/B in a column. A precharging PMOS transistor QP30 is connected to the detection line COMi for precharging it to a "H" level.

At a verify-judgment time, input a verify-check signal VERCHK to the gate of NMOS transistor Q13, and verify-read data is detected. As a result of verify-read operation, in case the entire bits have been completely written, the data latches 21 of one page become an all "1" state (N1="H"), while in case there is at least one bit, into which "0" data is insufficiently written, the corresponding data node N1 becomes "L".

The detection line COMi is precharged to a "H" level after write-verify, and the verify-check signal VERCHK is input. If the whole bits in column "i" have been completely written, PMOS transistor QP1 is kept off, and the detection line COMi is not discharged. When at least one bit has not been written, PMOS transistor QP1 turns on, thereby discharging the detection line COMi to be in a "L" state. With monitoring the above-described voltage change of the detection line COMi, verify-judgment (i.e., pass/fall detection) may be performed.

The pass/fail detection circuit 13 shown in FIG. 1, which is coupled to the detection lines COMi in the sense amplifier circuit 2, has a function of performing the above-described pass/fail judgment and another function of detecting fail is number (fail bit number or fail column number) for the verify-read result of each write cycle.

Figure 6:
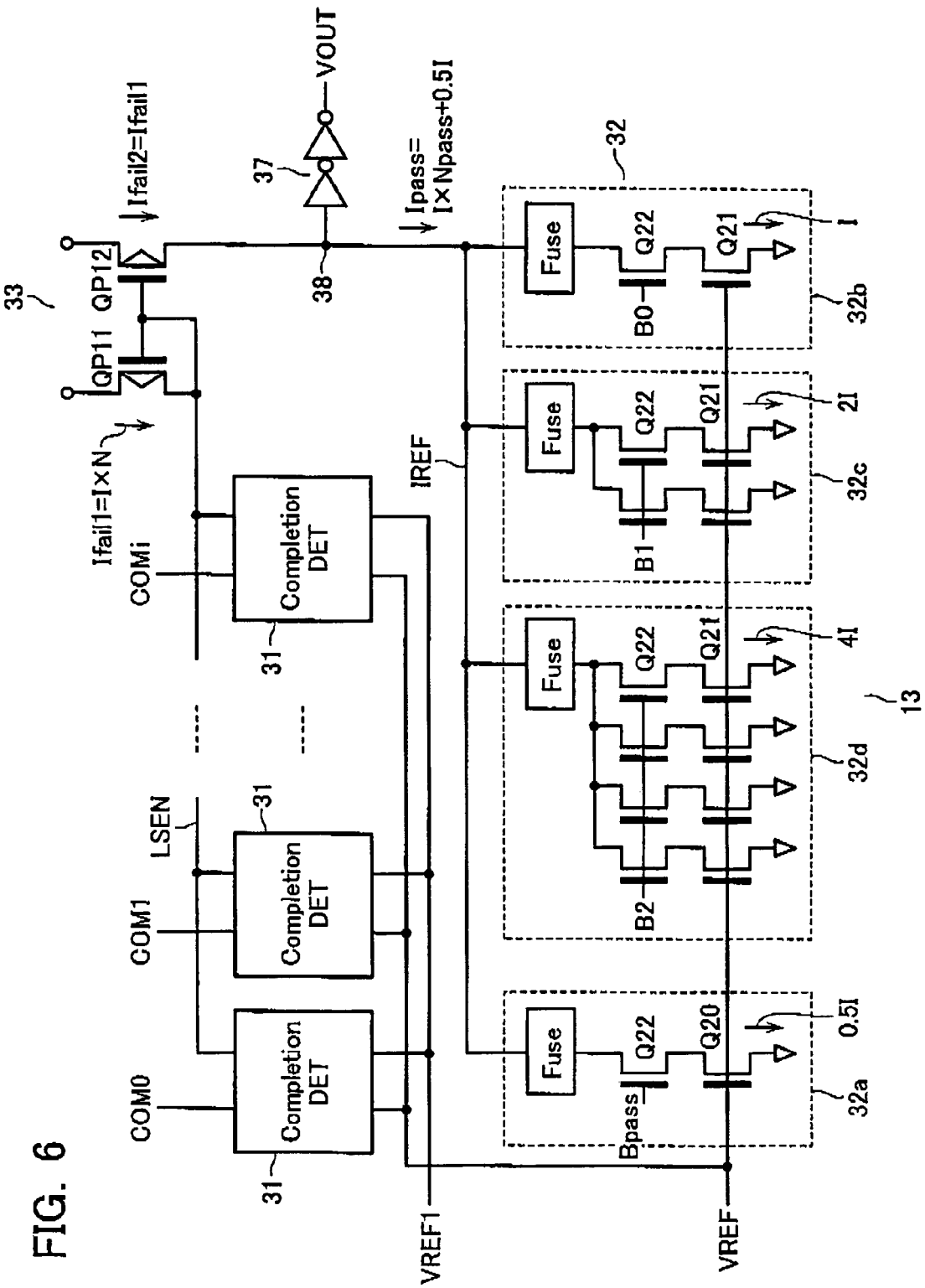
FIG. 6 shows a configuration of a pass/fail detection circuit of the flash memory.
Figures 7, 8:
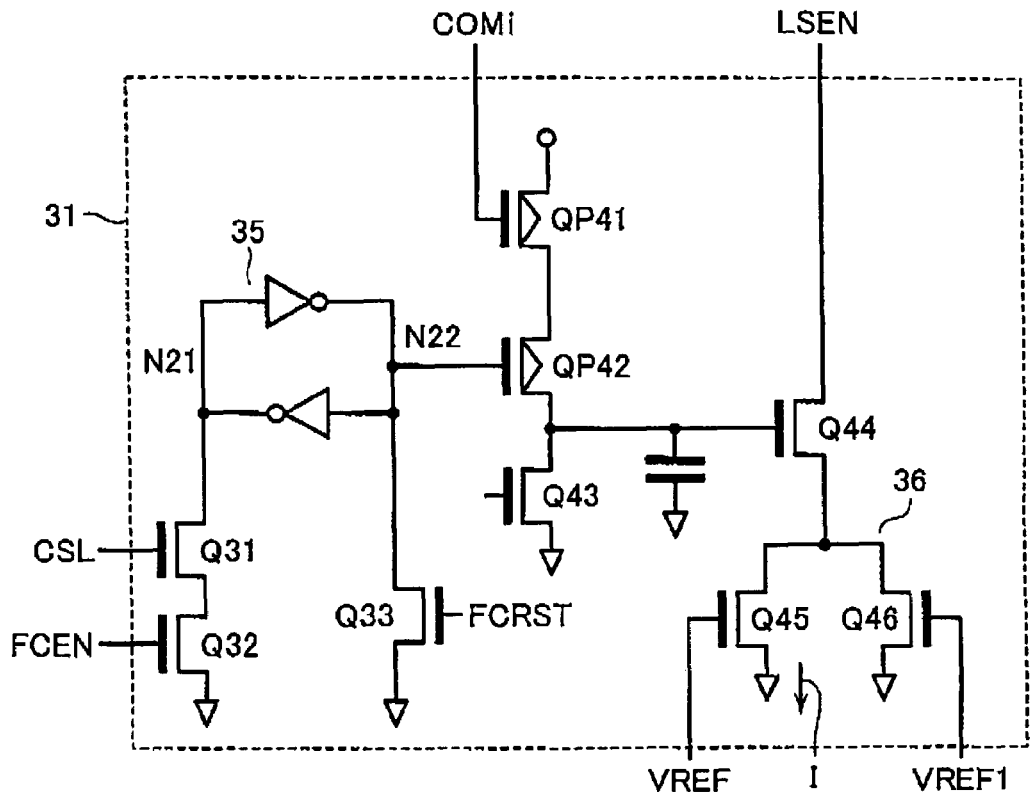
FIG. 7 shows a configuration of a write4 completion detection circuit in the pass/fail detection circuit.
FIG. 8 shows a diagram for explaining the principle of the tail detection in the pass/fail detection circuit.

The detailed configuration of the pass/fail detection circuit 13 is shown in FIGS. 6 and 7.

As shown in FIG. 6, the pass/fail detection circuit 13 has write completion detection circuits 31, which are connected to the detection lines COMi (i=0,1, . . . ) of the respective columns. Each write completion detection circuit 31 is a level transition detection circuit for detecting level transition (level change) of the detection line COMi, and serves as a pre-sense circuit.

The output nodes of the write completion detection circuits 31 are coupled common to a second detection line LSEN. As described later, each write completion detection circuit 31 is formed to detect level lowering of the first detection line COMi at when there is a fail bit in the column, thereby carrying a certain current therein. Therefore, a sum of currents flowing in the write completion circuits 31, which defined by the fail number (fail bit number or fail column number), flows on the second detection line LSEN.

Pass/fail judgment is performed based on the current flowing on the second detection line LSEN in correspondence with the fail number. To do this judgment in comparison with a permissible fail number, a permissible fail number setting circuit 32 is prepared, which constitutes a reference current source circuit.

The write completion detection circuit 31 has, as shown in FIG. 7, PMOS transistor QP41, the gate and source of which are connected to the first detection line COMi and Vcc, respectively, and PMOS transistor QP42, the gate and source of which are connected to data node N22 of data latch 35 and the drain of PMOS transistor QP41, respectively. The data latch 35 stores "defective column isolation data" used for excluding a defective column from the verify-judgment target (i.e., pass/fail detection target). That is, the data latch 35 is preset to have such a column isolation data that the data node N22 is "H". With this column isolation data set, PMOS transistor QP42 turns on only for a normal column.

The drain of PMOS transistor QP42 is coupled to the gate of NMOS transistor Q44, the drain and source of which are connected to the second detection line LSEN and current source circuit 36, respectively.

The current source circuit 36 has two current source NMOS transistors Q45 and Q46 connected in parallel, which are selectively used. A reset-use NMOS transistor Q43 is connected to the gate of NMOS transistor Q44.

Current source transistor Q45 defines current I flowing on the second detection line LSEN at when NMOS transistor Q44 turns on in response to the "L" level transition of the first detection line COMi. Since the entire output nodes of the detection circuits 31 are wired-OR connected to the second detection line LSEN, on which current, Ifail1=I×N, flows in accordance with the fail number (fail bit number or fail column number) N.

Current source transistor Q45 is for flowing current I in such a case that the permissible fail number is zero (i.e., in case at least one is insufficiently written, it is dealt with "Fail"). By contrast, the current source transistor Q46 is designed to have a half size in comparison with transistor Q45 so as to flow 0.5I in such a case that two fails are to be permitted. These transistors Q45 and Q46 are selectively activated with control signals VREF and VREF1, respectively.

The defective column isolation data is written into the initial setup data area in the memory cell array 1 based on the test result before shipment, and it is automatically read out at the power-on time to be transferred to and written into the data latch 35. Conventionally, the column isolation data is not rewritten hereinafter. In this embodiment, however, the data stored in the data latch 35 is rewritable for excluding a late generated defective column from the pass/fail detection target.

For the purpose of this, NMOS transistors Q31 and Q32, gates of which are driven with a column select signal CSL and an activation signal FCEN, respectively, are connected in series between the data node N21 and the ground node Vss. Further, reset-use NMOS transistor Q33 is connected to the data node N22.

As described later, column defect(s) may be detected in a test mode after shipment. In case a column defect is found, a column isolation data is written into the data latch 35 in response to a command input. That is, NMOS transistors Q31 and Q32 turn on in response to the column select signal CSL and activation signal FCEN output from the controller 10, thereby resulting in that the column isolation data is latched in the data latch 35 as follows: N21="L"; and N22="H".

As described above, current, Ifail1, is obtained in accordance to the fall number on the common detection line LSEN of the detection circuits 31 of the entire columns. The permissible fall number setting circuit 32 outputs a reference current, Ipass, corresponding to a permissible fail number, with which the current Ifail1 is compared. The permissible fail number setting circuit 32 has a plurality of current source circuits 32a, 32b, 32c and 32d.

The current source 32a has a current source NMOS transistor Q20 for flowing current "0.5I". This transistor Q20 is coupled to a common node IREF via a select transistor Q22 driven with a signal Bpass and a fuse circuit. The current source 32b has a current source NMOS transistor Q21 for flowing current "I". This transistor 021 is also coupled to the common node IREF via a select transistor Q22 driven with a signal B0 and a fuse circuit. The current source 32c has two current source NMOS transistors Q21 for flowing current "2I", which is also coupled to the common node IREF via select transistors and a fuse circuit. The current source 32d has four current source NMOS transistors Q21 for flowing current "4I", which is also coupled to the common node IREF via select transistors and a fuse circuit.

The select transistors 022 of the current sources 32b, 32c and 32d will be activated with select signals B0, B1 and B2, respectively, which define a permissible fail number. Note here that the select signal Bpass controlling the current source 32a is kept "H" during the pass/fail detection time.

At the pass/fail detection time, current Ipass, which flows on the common node IMF in correspondence to a permissible fail number Npass, will be defined by the select signals B0-B2 as follows: Ipass=I×Npass+0.5I.

To compare the current Ifail1 flowing on the common detection node LSEN of the whole columns' detection circuits 31 with the current Ipass flowing on the common node IREF of the permissible fail number setting circuit 32, a PMOS current mirror circuit 33 is prepared to have PMOS transistors QP11 and QP12. The gate and drain of PMOS transistor QP11 are coupled to the detection line LSEN; and the drain of PMOS transistor QP12 to the node IREF via a voltage detection node 38, to which an output circuit 37 with two inverters is coupled. Supposing that transistors QP11 and QP12 have the same size, current Ifail2 (=Ifail1) is carried from the drain of transistor QP12.

Current mirror circuit 33, detection node 38 and output circuit 37 constitute a current comparing circuit. The level of the detection node 38 is defined by which of Ifail2 (=Ifail1) and Ipass is large or small. Therefore, perform verify judgment with a certain combination of 3-bit select signals B0-B2, and it may be generated an output signal, iVOUT="H", on the output node VOUT at when Ifail2 is over Ipass. This output signal serves as a "Fail" flag, which is defined in accordance with the permissible fail number.

The detail will be explained below. In case of (B2,B1,B0)=(0,0,0), Ipass is equal to 0.5I. If all column verify is "Pass", Ifail2 is equal to zero, and the output VOUT is "L". As a result of this, it may be judged whether there is one or more fails or not. In case of (B2,B1,B0)=(0,0,1), Ipass is equal to I+0.5I. Therefore, compare Ifail2 with it, and it may be judged whether there are two or more fails or not.

Other cases are defined as similar to the above-described examples. As summarized in FIG. 8, the permissible fail number is defined by the select signal (B2,B1,B0). By use of this, it becomes possible to perform pass/fail judgment based on the permissible fail number, which may be suitably set.

Further, while the select signal (B2, B1, B0) is incremented, monitor when the output VOUT becomes "H", and it becomes possible to get the fail number. That is, the pass/fail detection circuit 13 functions as a fail number counter.

Note here that fail bit detection and fail column detection may selected in accordance with whether the verify-check signal VERCHK is applied to eight sense units P/B in a column independently or simultaneously. In detail, if write-verify is performed for every bit in a write cycle, the verify-check signal VERCHK is successively applied to eight sense units P/B in a column. With this verify, pass/fail may be detected by a bit. By contrast, if the verify-check signal VERCHK is applied to eight sense units P/B at a time, the detection line COMi becomes "L" at when there is at least one fail bit in a column. Therefore, it becomes possible to detect pass/fail by a column.

Figure 9:
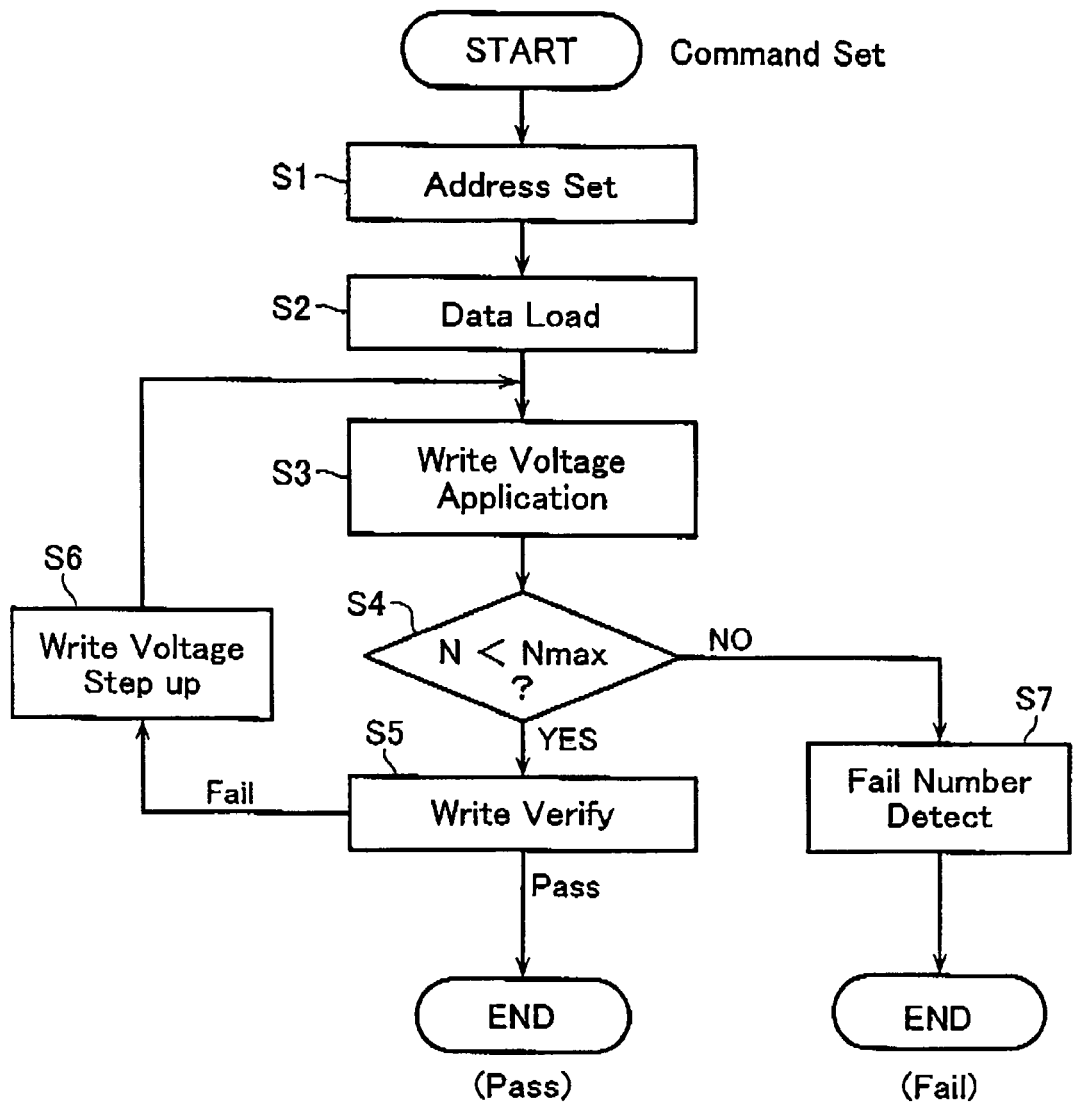
FIG. 9 shows a write sequence of the flash memory.

FIG. 9 shows a flow chart of data write in accordance with this embodiment. This write mode is set in response to a write command input. Input write address (step S1), and then load one page write data into the sense amplifier circuit 2 (step S2), and data write into a selected page is automatically executed under the control of the controller 10.

Data write is performed with a write voltage application to a selected word line corresponding to the selected page (step S3). In detail, Vss and Vcc−Vth (Vth: threshold voltage of the select gate transistor) are applied to NAND cell channels from the sense amplifier circuit 2 via selected bit lines in accordance to write data "0" and "1", respectively. The NAND cell channel, to which "1" data (write inhibiting) is applied, is boosted to Vcc−Vth to be in a floating state.

As the write voltage is applied in such a state, electrons are injected into the floating gate of a "0" write cell, whereby "0" data is written into it, which is defined as a positive threshold voltage state. In the "1" write cell, electron injection does not occur due to channel boosting.

After the write voltage application, it is judged whether the number of write cycles has reached the maximum value Nmax or not (step S4). If having not reached, write-verify is performed (step S5). Pass/fail judgment with respect to the verify result is performed under such a select signal condition of: (B2,B1,B0)=(0,0,0) that if there is at least one insufficiently written cell, it is detected as "Fail". If the judging result is "Fail", the write voltage is stepped up (step S6), following it the write-voltage is applied again (step S3).

One page write completion is confirmed, the write-verify is judged as "Pass", and the write sequence ends. In case the data write is not completed in spite of that the number of write cycles has reached Nmax, it should be finished in failure. At this time, fail number detection is performed (step S7). The detected fail number is output to a host device disposed outside of the chip.

In case there is generated after shipment such a defect or drawback (for example, bit line short-circuit or bit line open) that makes the memory disabled for data write in the above-described write sequence, the write-verify is never passed, and the data write will be repeated until the write cycle number reaches Nmax. Even if the fail number is in a permissible range, the above-described situation leads to such a problem that makes the write time long.

According to this embodiment, in consideration of the above-described situation, the late generated defect such as a bit line drawback is detected, and the detected defect portion will be excluded from the verify judgment target.

Figure 10:
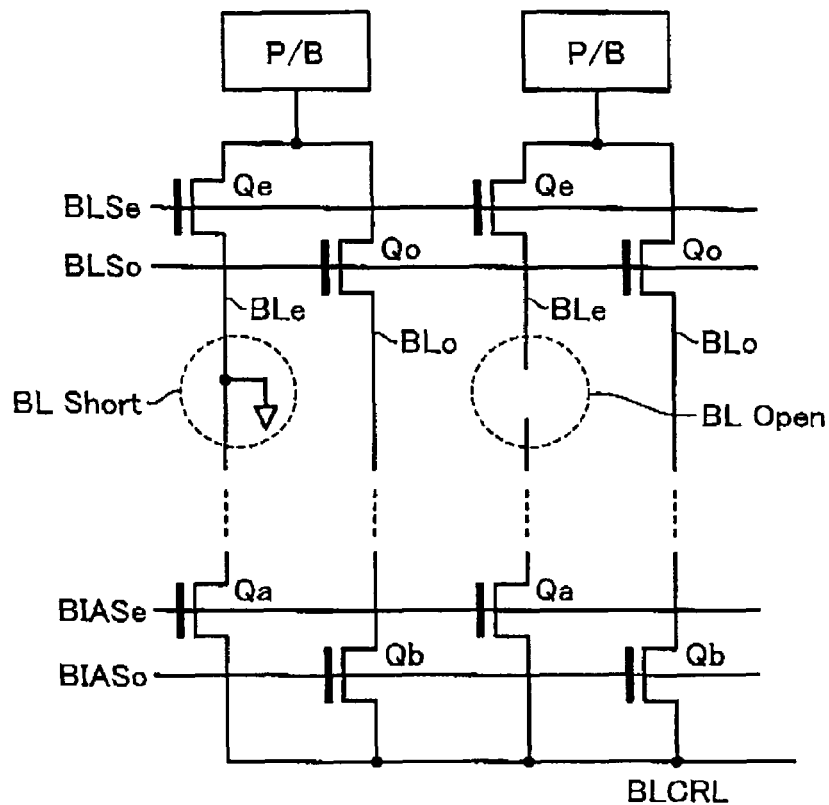
FIG. 10 shows a diagram for explaining the method of detecting bit line defects of the flash memory.

FIG. 10 shows a circuit configuration necessary for checking a bit line defect. One ends of the bit lines BLe and BLo are coupled to the sense units P/B via select transistors Qe and Qo, respectively; while another ends thereof are coupled to a signal line BLCRL, which is normally set at ground potential, via select transistors Qa and Qb, respectively.

FIG. 10 shows two bit lines BLe, a short-circuited bit line and an opened bit line. In this embodiment, issue a certain command, and a check operation is automatically performed for checking these bit line defects.

Figure 11:
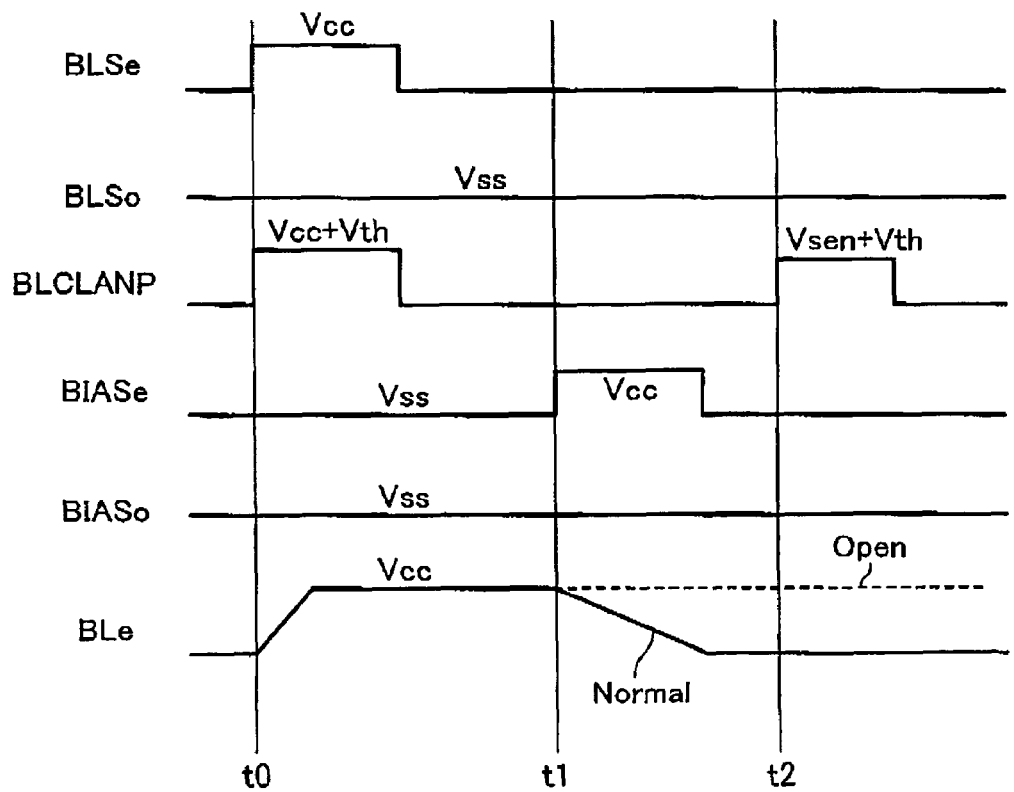
FIG. 11 shows waveforms of detecting bit line open defects.

FIG. 11 shows operation waveforms for checking the bit line open defect. The entire select gate transistors of NAND cell units, which are connected to bit lines, are kept off. FIG. 11 shows a check operation for even numbered bit lines BLe. Set the select signal BLSe to be "H" at timing t0; simultaneously apply a "H" level (Vcc+Vth) to the gate BLCLAMP of the clamping transistor Q1 in the sense unit P/B, and make the precharge transistor Q2 on.

As a result, the selected bit lines BLe are charged up to Vcc. After having set BLSe, BLCLAMP to be "L", a "H" level select signal BIASe is applied to the select-transistors Qa at timing t1. At this time, a normal bit line BLe will be discharged. By contrast, with respect to an open-defect bit line BLe, at least a sense amplifier side portion of it is not discharged and kept "H" as shown by a dotted line in FIG. 11.

After the bit line discharge operation for a certain period, sense-use voltage Vsen+Vth is applied to the gate BLCLAMP of the clamping transistor Q1 at timing t2 so as to detect "H" or "L" of the bit lines BLe. As a result, open-defect bit lines may be detected. Odd numbered bit lines BLo may be checked as similar to the even numbered bit lines BLe.

Figure 12:
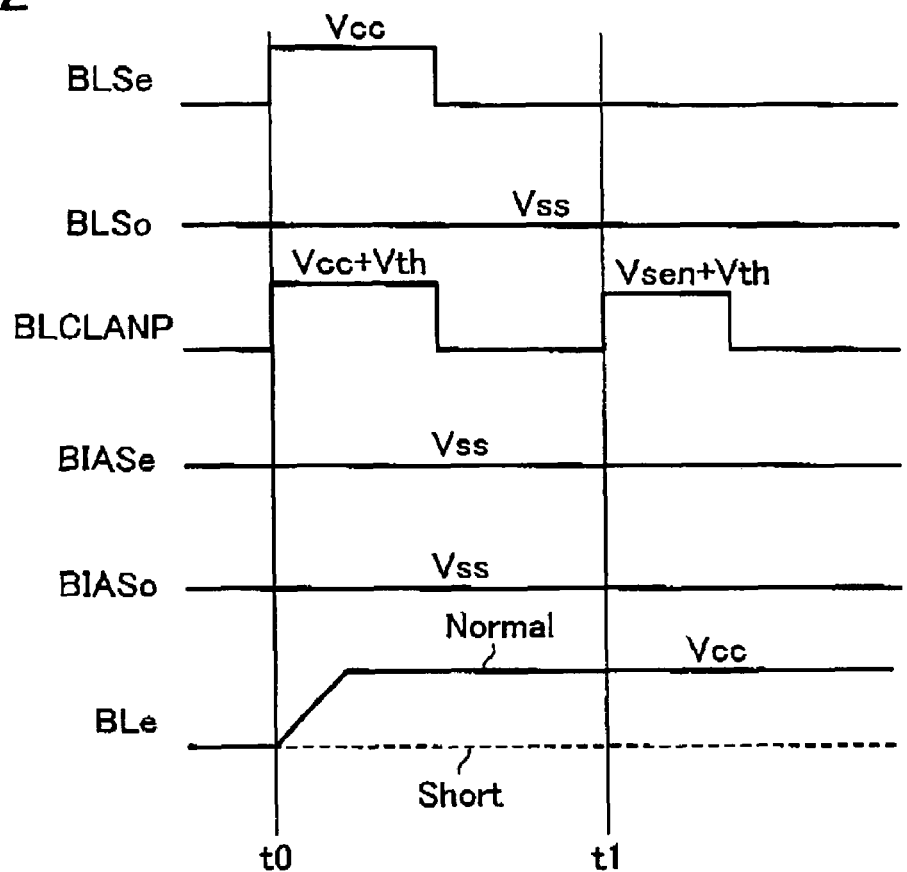
FIG. 12 shows waveforms of detecting bit line short-circuit defects.

FIG. 12 shows operation waveforms for checking the bit line short-circuit defect when even numbered bit lines BLe are selected. Set the select signal BLSe to be "H" at timing t0; simultaneously apply a "H" level (Vcc+Vth) to the gate BLCLAMP of the clamping transistor Q1 in the sense unit P/B, and make the precharge transistor Q2 on.

As a result, if the selected bit lines BLe are normal, these are charged up to Vcc. By contrast, if there is a bit line short-circuit defect, the corresponding bit line will not be charged up as shown by a dotted line in FIG. 12.

After setting BLSe and BLCLAMP to be "L", sense-use voltage Vsen+Vth is applied to the gate BLCLAMP of the clamping transistor Q1 at timing t1 so as to detect "H" or "L" of the bit lines BLe. As a result, short-circuit defects of bit lines may be detected.

Figure 13:
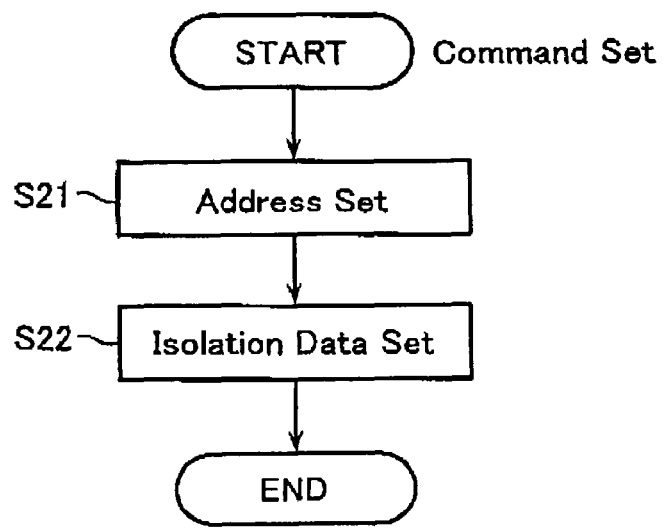
FIG. 13 shows a data write flow of writing the defective column isolation data.

To exclude the column defect detected as described above from the verify judgment target, defective column isolation, data will be written with a command input. As shown in FIG. 13, after a certain-command input, a detected column address is input (step S21). As a result, in the verify judgment circuit 31 corresponding to the detected column address, the column select signal CSL and control signal FCEN transferred from the controller 10 become "H" so that defective column isolation data such as: N21="L" and N22="H" is written into the data latch 35 (step S22).

As a result, it becomes possible to prevent the memory from being made long in write time due to the late generated defects. To count the fail number in a case where the permissible fail number is eight, it is in need of scanning the entire combinations of select signals B0-B2, thereby taking a long time. Therefore, in a case where the defective column found later is excluded from the verify-judgment target as described above, it is desirable to reduce the permissible fail number. As a result, the fail number counting time may be shortened, and it makes the total data write time short.

Embodiment 2

Figure 14:
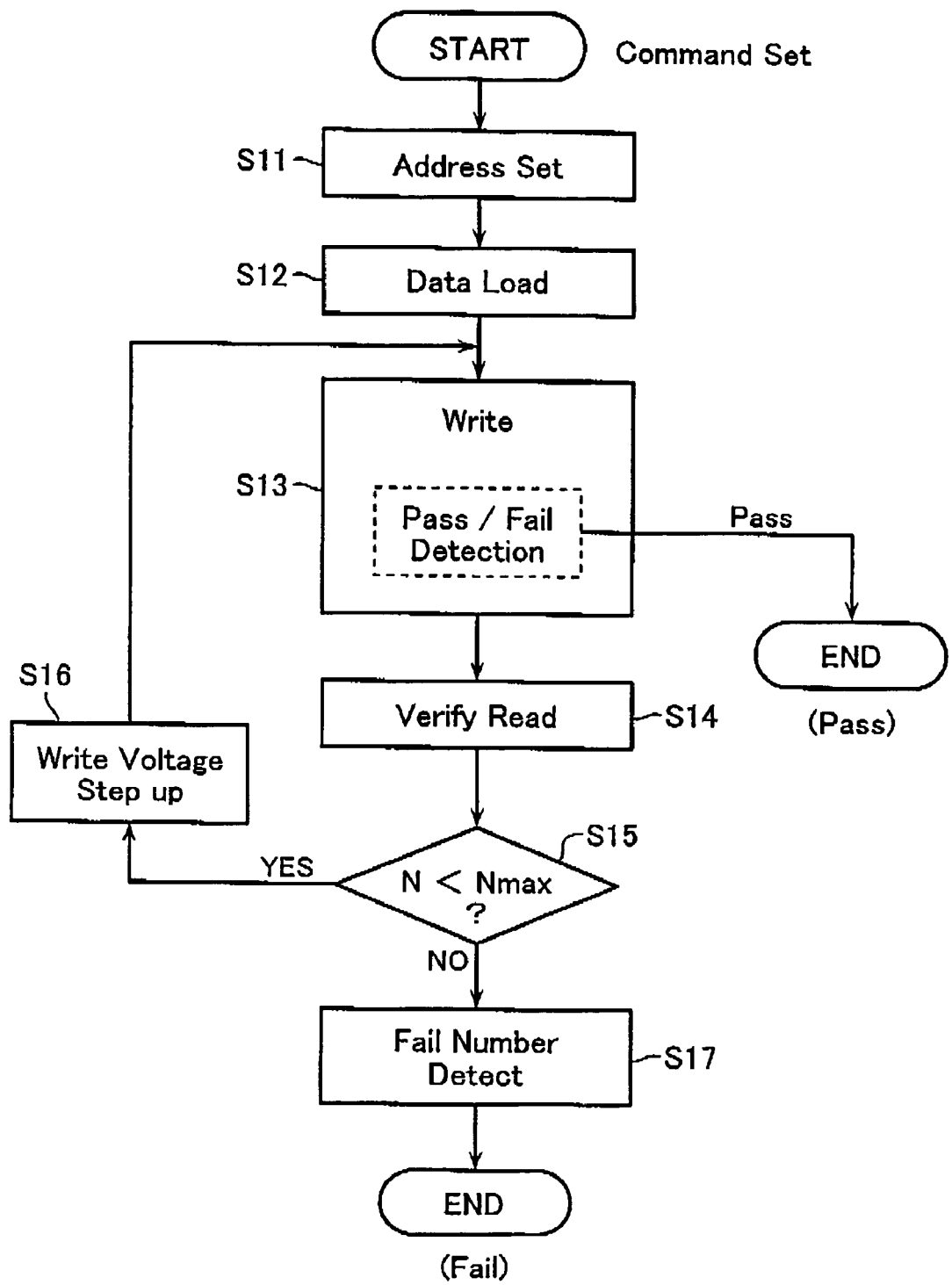
FIG. 14 shows a write sequence in accordance with another embodiment.

There will be provided another method of effectively shorten the write time without writing isolation data for defective columns found lately. FIG. 14 shows a write sequence using the above-described method.

Input a certain command, and this write sequence starts. Following the command, an address is input (step S11), and write data are loaded (step QS12). So far, it is the same as the above-described embodiment, and write operations are automatically executed hereinafter under the control of the controller 10.

In this embodiment, verify-judgment (pass/fail judgment) is executed in the background of the write step S13 based on the last verify-read data. Explaining in detail, in order to apply a write voltage, it is in need of taking a time for charging up write-inhibiting bit lines and non-selected bit lines. In this embodiment, the pass/fail judgment is executed within a preparation period necessary for applying the write voltage. If it is judged "Pass", the data write sequence ends without applying the write voltage.

Note here, what is held in the sense amplifier circuit at the initial write cycle is not verify-read dada of the last cycle, but write data as it is. Since the verify judgment is performed at this time based on the write data, it is judged "Fail". In case of "Fail", the write voltage is applied, following it the verify-read is performed (step S14).

Next, it is judged whether the number of write cycles has reached the maximum Nmax or not (step S15). If having not reached the maximum Nmax, the write voltage is stepped up (step S16), and then the write voltage is applied again (step S13). In case the write cycles have reached the maximum Nmax, fail number counting is performed (step S17), and then the sequence ends.

The pass/fail judgment in the write step S13 is set as to output "Fail" at when one bit is insufficiently written in a case where there are no defects newly found. In a case where a defect or defects have been founded, it will be set in such an operation mode that the fail column number is set as a permissible fail number in the pass/fail judgment circuit 13. Supposing, for example, that the fail column number is four, the pass/fail judgment is performed under the condition of that the select signals are set as: (B2,B1,B0)=(1,0,0). Under this condition, as explained in FIG. 8, VOUT="H"(Fail) is obtained at when the number of fails is five or more.

The pass/fail judgment with the permissible defective columns takes a longer time in comparison with that without a permissible defective column (i.e., even if there is one defect, it should be judged "Fail"). In this embodiment, however, the pass/fail judgment is executed in the background of the write step, so that the write time period may be shortened as a whole.

Fail number data is, for example, stored in the parameter register 8, and it controls pass/fail judgment. To change the permissible fail number based of a defect found after shipment, a certain command is input, and in response to it the parameter register 8 is rewritten.

Further, it is also desirable to increase the permissible fail number in the step S17 for counting the fail number based on the column defect found after shipment so that it becomes larger than that of the usual case.

So far, the data write operation has been explained. The present invention may be adapted to data erase, and the same effect will be obtained as the data write. Usually, data erase is executed by a block with an erase voltage application and the following erase-verify, which are alternately and repeatedly performed. Although the bias condition in the erase-verify read operation is different from that in the write-verify, the principle method is the same as that in the write-verify, in which a bit line charge or discharge state is detected with the sense amplifier circuit. Therefore, erase-verify judgment may be performed with the above-described pass/fail detection circuit 13. In this case, the write completion detection circuit 31 serves as an erase completion detection circuit.

If a bit line defect, such as short-circuit or open, is generated, it is not judged "Pass", and it takes a long time for erasing. This also is the same as in the data write. Therefore, write a defective column isolation data based on the column fail found after shipment, and the erase time may be shortened.

Embodiment 3

As an embodiment, an electric card using the non-volatile semiconductor memory devices according to the above-described embodiments of the present invention and an electric device using the card will be described bellow.

Figure 15:
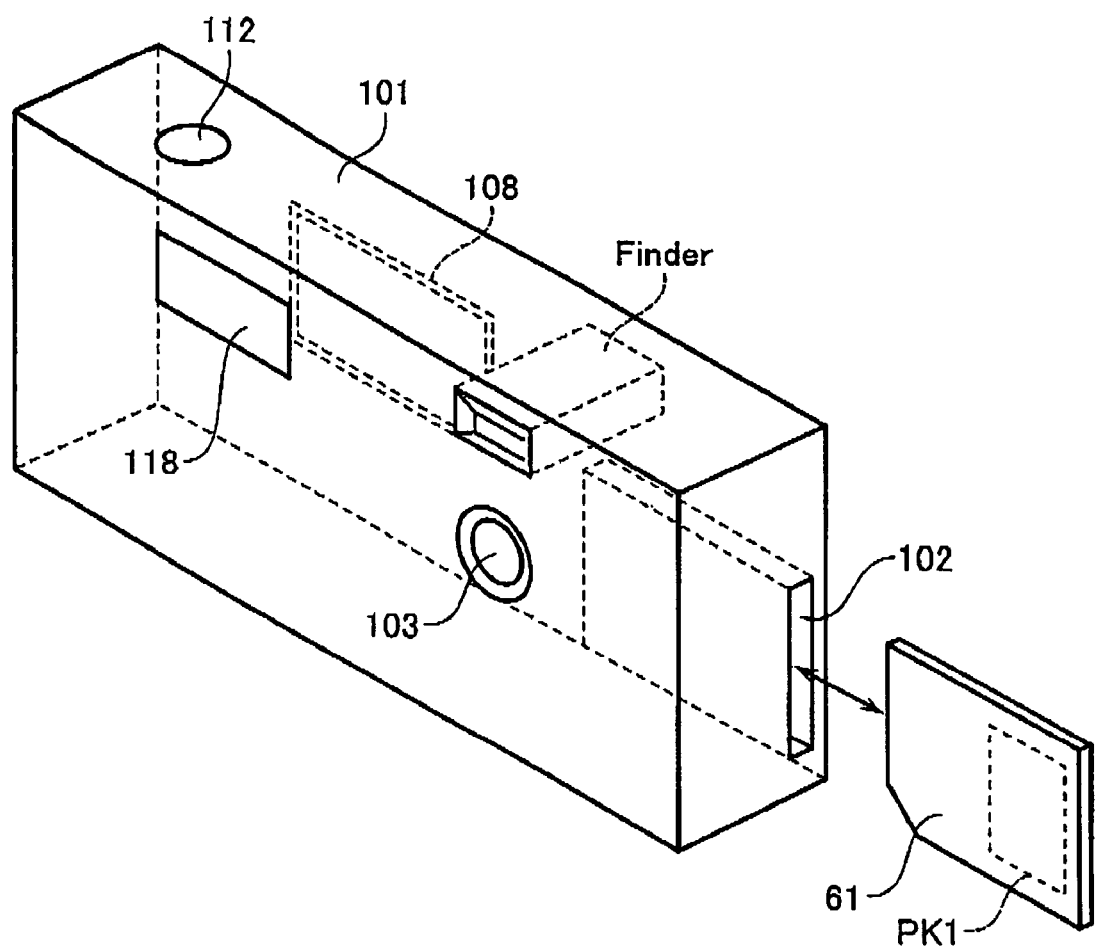
FIG. 15 shows a digital still camera in accordance with another embodiment.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
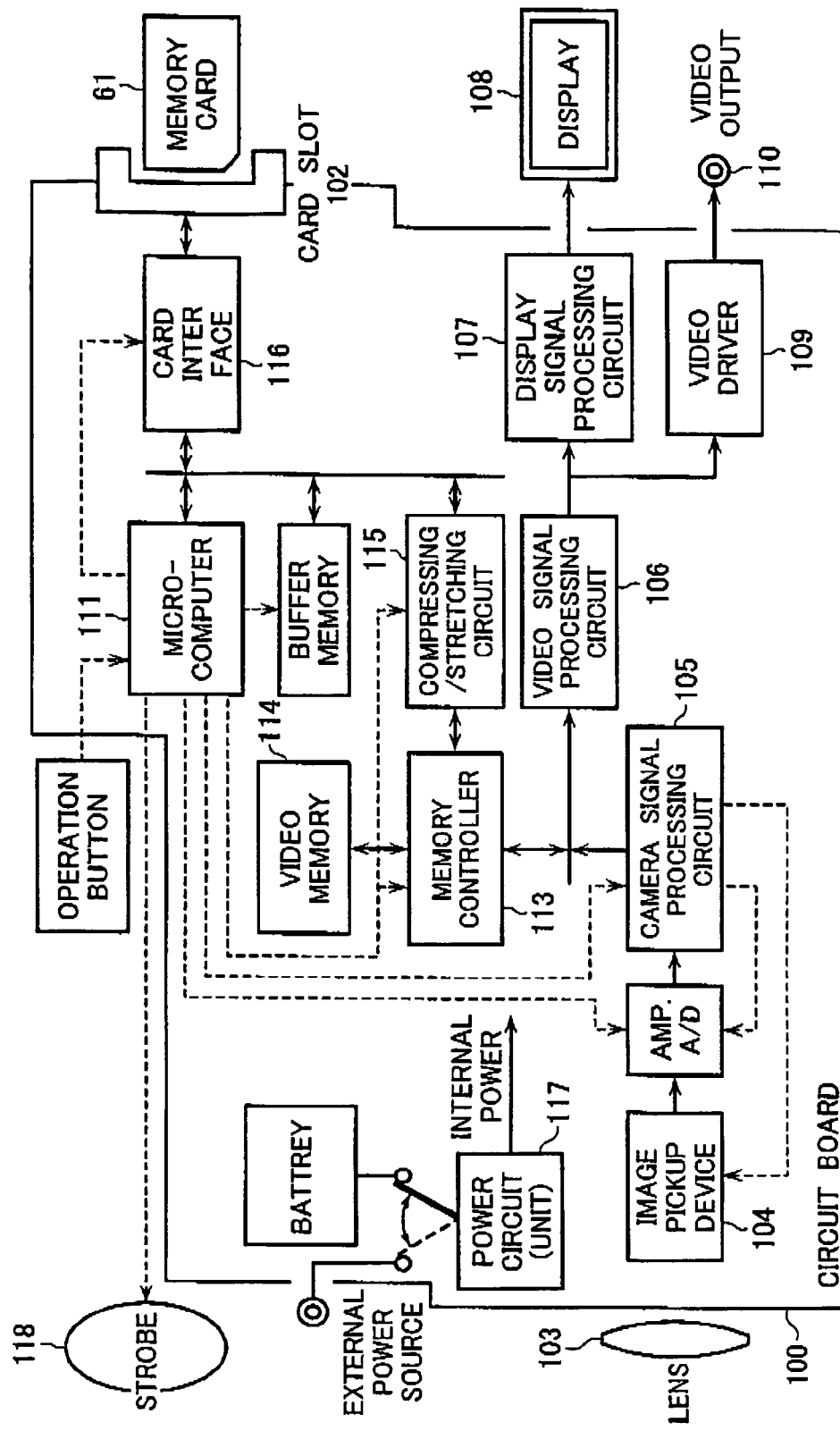
FIG. 16 shows the internal configuration of the digital still camera.
Figure 17A:
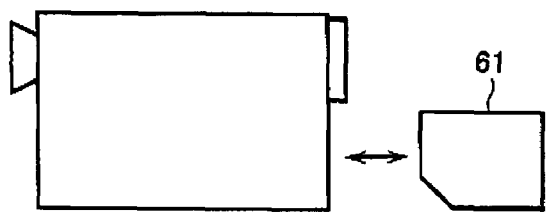
FIGS. 17A to 17J show other electric devices to which the embodiment is adapted.
Figure 17F:
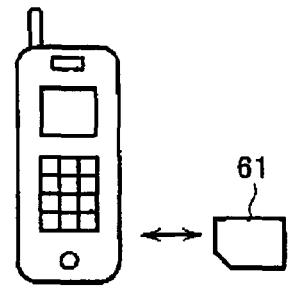
Figure 17B:
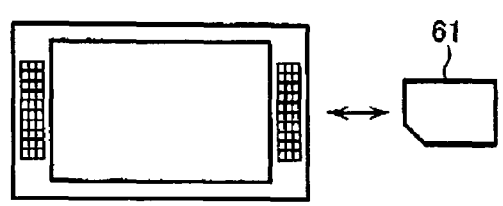
Figure 17G:
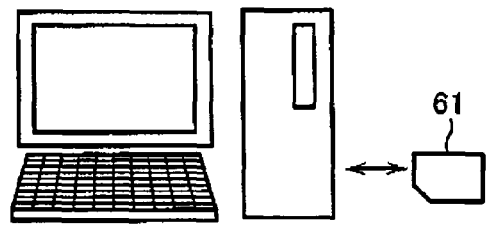
Figure 17C:
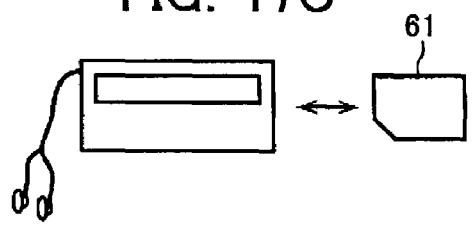
Figure 17H:
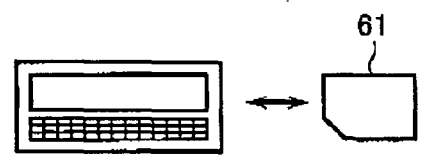
Figure 17D:
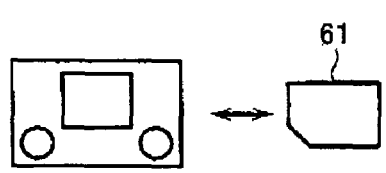
Figure 17I:
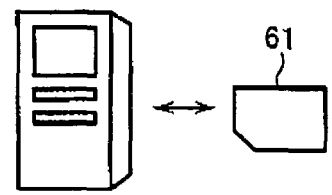
Figure 17E:
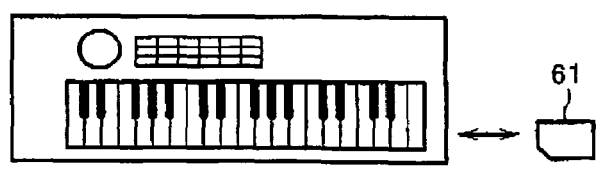
Figure 17J:
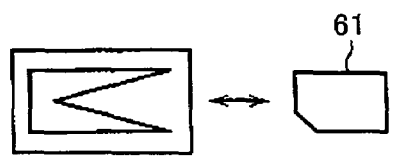

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising:
   a memory cell array, in which electrically rewritable and non-volatile memory cells are arranged;
   a sense amplifier circuit configured to read data of the memory cell array; and
   a pass/fail detection circuit configured to detect write or erase completion based on verify-read data stored in the sense amplifier circuit in data write or erase mode, wherein
   the pass/fail detection circuit comprises a data latch, into which a defective column isolation data is writable in accordance with a command input,
   and wherein the pass/fail detection circuit comprises:
   a plurality of first detection lines disposed for the respective columns in the sense amplifier circuit to be changeable in level in a pass/fail detection mode;
   a plurality of completion detection circuits each configured to flow a certain current in response to the level change of the corresponding first detection line for detecting write or erase completion;
   a second detection line coupled common to output nodes of the completion detection circuits, on which a sum of currents of the completion detection circuits flows;
   a permissible fail number setting circuit configured to output a reference current, which is settable in response to a permissible fail number with a plurality of current sources;
   a comparator circuit configured to compare the current of the second detection line with the reference current set with the permissible fail number setting circuit, and output a pass/fail signal; and
   data latches connected to the completion detection circuits, respectively, for storing defective column isolation data, into which defective column isolation data are writable in accordance with a command input.

2. The non-volatile semiconductor memory device according to claim 1, wherein
   the device has a defective bit line detection mode, in which bit lines of the memory cell array are charged or discharged in response to a command; and then the sense amplifier detects whether the bit lines are opened or shorted-circuit.

3. The non-volatile semiconductor memory device 10 according to claim 1, wherein
   the memory cell array has NAND cell units arranged therein, each NAND cell unit having a plurality of memory cells connected in series.

4. A non-volatile semiconductor memory device comprising:
   a memory cell array, in which electrically rewritable and non-volatile memory cells are arranged;
   a sense amplifier circuit configured to read data of the memory cell array; and
   a pass/fail detection circuit configured to detect write or erase completion based on verify-read data stored in the sense amplifier circuit in data write or erase mode, wherein the pass/fail detection circuit comprises:
   a plurality of first detection lines disposed for the respective columns in the sense amplifier circuit to be changeable in level in a pass/fail detection mode;
   a plurality of completion detection circuits each configured to flow a certain current in response to the level change of the corresponding first detection line for detecting write or erase completion;
   a second detection line coupled common to output nodes of the completion detection circuits, on which a sum of currents of the completion detection circuits flows;
   a permissible fail number setting circuit configured to output a reference current, which is settable in response to a permissible fail number with a plurality of current sources;
   a comparator circuit configured to compare the current of the second detection line with the reference current set with the permissible fail number setting circuit, and output a pass/fail signal; and
   data latches connected to the completion detection circuits, respectively, for storing defective column isolation data, into which defective column isolation data are writable in accordance with a command input.

5. The non-volatile semiconductor memory device according to claim 4, wherein
   the device has a defective bit line detection mode, in which bit lines of the memory cell array are charged or discharged in response to a command; and then the sense amplifier circuit detects whether the bit lines are opened or short-circuited.

6. The non-volatile semiconductor memory device according to claim 4, wherein
   the memory cell array has NAND cell units arranged therein, each NAND cell unit having a plurality of memory cells connected in series.

7. A non-volatile semiconductor memory device comprising:
   a memory cell array, in which electrically rewritable and non-volatile memory cells are arranged;
   a sense amplifier circuit configured to read data of the memory cell array;
   a pass/fail detection circuit configured to detect write or erase completion based on verify-read data stored in the sense amplifier circuit in data write or erase mode; and
   a controller configured to control a write sequence by repeat of write and write-verify, and make the pass/fail detection circuit do verify-judgment within a write steps,
   and wherein the pass/fail detection circuit comprises:
   a plurality of first detection lines disposed for the respective columns in the sense amplifier circuit to be changeable in level in a pass/fail detection mode;
   a plurality of completion detection circuits each configured to flow a certain current in response to the level change of the corresponding first detection line for detecting write or erase completion;
   a second detection line coupled common to output nodes of the completion detection circuits, on which a sum of currents of the completion detection circuits flows;
   a permissible fail number setting circuit configured to output a reference current, which is settable in response to a permissible fail number with a plurality of current sources;
   a comparator circuit configured to compare the current of the second detection line with the reference current set with the permissible fail number setting circuit, and output a pass/fail signal; and
   data latches connected to the completion detection circuits, respectively, for storing defective column isolation data, into which defective column isolation data are writable in accordance with a command input.

8. The non-volatile semiconductor memory device according to claim 7, wherein the device has a defective bit line detection mode, in which bit lines of the memory cell array are charged or discharged in response to a command; and then the sense amplifier circuit detects whether the bit lines are opened or short-circuited, the permissible fail number in the pass/fail detection circuit being set based on the result of the defective lit line detection mode.

9. The non-volatile semiconductor memory device according to claim 7, wherein
the memory cell array has NAND cell units arranged therein, each NAND cell unit having a plurality of memory cells connected in series.

* * * * *